US007408380B1

(12) United States Patent
Hassoun et al.

(10) Patent No.: US 7,408,380 B1
(45) Date of Patent: Aug. 5, 2008

(54) METHOD AND APPARATUS FOR A REDUNDANT TRANSCEIVER ARCHITECTURE

(75) Inventors: Marwan M. Hassoun, Davis, CA (US); Moises E. Robinson, Austin, TX (US); David E. Tetzlaff, Minneapolis, MN (US)

(73) Assignee: XILINX, Inc., San Jose, CA (US)

( * ) Notice: Subject to any disclaimer, the term of this patent is extended or adjusted under 35 U.S.C. 154(b) by 80 days.

(21) Appl. No.: 11/435,427

(22) Filed: May 16, 2006

(51) Int. Cl.
*H03K 19/003* (2006.01)
(52) U.S. Cl. .......................... 326/38; 326/10
(58) Field of Classification Search .................. 326/10, 326/16; 327/526
See application file for complete search history.

(56) References Cited

U.S. PATENT DOCUMENTS

| 5,498,975 | A  | * | 3/1996 | Cliff et al. ................. 326/10 |
| 6,107,820 | A  | * | 8/2000 | Jefferson et al. ............ 326/38 |
| 6,285,211 | B1 | * | 9/2001 | Sample et al. .............. 326/41 |
| 7,055,069 | B2 | * | 5/2006 | Isom et al. .................. 714/43 |
| 2005/0007147 | A1 | * | 1/2005 | Young ........................ 326/41 |

* cited by examiner

*Primary Examiner*—Rexford Barnie
*Assistant Examiner*—Thienvu V Tran
(74) *Attorney, Agent, or Firm*—Michael T. Wallace

(57) ABSTRACT

A method and apparatus to provide various mechanisms to improve yield of an integrated circuit (IC) employing serial input/output (I/O) communication devices. A single error correction model provides one spare transceiver per group of primary transceivers, whereby reconfiguration of the IC isolates the defective transceiver and configures the replacement transceiver for operation in its place. A multiple error correction model is also provided, whereby multiple replacement transceivers may be configured to replace multiple defective transceivers. The replacement mechanism may occur during various phases of the IC, such as during wafer testing, final testing, or post-deployment testing.

18 Claims, 5 Drawing Sheets

METHOD AND APPARATUS FOR A REDUNDANT TRANSCEIVER ARCHITECTURE

FIELD OF THE INVENTION

The present invention generally relates to Integrated Circuits (ICs), and more particularly to ICs exhibiting redundant architectures for increased yield.

BACKGROUND

PLDs are a well-known type of IC that may be programmed to perform specified logic functions. One type of PLD, the Field Programmable Gate Array (FPGA), typically includes an array of programmable tiles. These programmable tiles can include, for example, Input/Output Blocks (IOBs), Configurable Logic Blocks (CLBs), dedicated Random Access Memory Blocks (BRAM), multipliers, Digital Signal Processing blocks (DSPs), processors, clock managers, Delay Lock Loops (DLLs), Multi-Gigabit Transceivers (MGTs) and so forth.

Each programmable tile typically includes both programmable interconnect and programmable logic. The programmable interconnect typically includes a large number of interconnect lines of varying lengths interconnected by Programmable Interconnect Points (PIPs). The programmable logic implements the logic of a user design using programmable elements that may include, for example, function generators, registers, arithmetic logic, and so forth.

The programmable interconnect and the programmable logic are typically programmed by loading a stream of configuration data into internal configuration memory cells that define how the programmable elements are configured. The configuration data may be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to Input/Output (I/O) resources by an interconnect switch matrix. Each function block of the CPLD includes a two-level AND/OR structure similar to those used in Programmable Logic Arrays (PLAs) and Programmable Array Logic (PAL) devices. In some CPLDs, configuration data is stored on-chip in non-volatile memory. In other CPLDs, configuration data is stored on-chip in non-volatile memory, then downloaded to volatile memory as part of an initial configuration sequence.

For all of these PLDs, the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

As discussed above, PLDs may provide a plurality of circuit topologies, whereby reconfigurable digital logic may coexist with high-speed analog circuitry to form a hybrid PLD implementation. In particular, certain PLDs may provide architectures that include MGTs along various columns of the PLD in order to support multi-channel, serial communications.

Implementing such hybrid implementations, however, presents some manufacturing challenges. In particular, while the reconfigurable portion of the PLD, i.e., the fabric, may achieve production yields in the, e.g., 90% range, the production yield of the high-speed analog circuitry may not be as high. Using current topologies, even if only a single MGT on a particular PLD is determined to be defective, then the entire PLD must be scrapped. Further, if the determination that the MGT is defective is not made until after packaging, then the economic loss sustained from scrapping the device is maximized, since most of the expenses associated with producing the PLD, e.g., wafer fabrication and packaging, have already been incurred. Efforts continue, therefore, to increase the yield of these hybrid ICs so as to reduce yield based economic losses.

SUMMARY

To overcome limitations in the prior art, and to overcome other limitations that will become apparent upon reading and understanding the present specification, the present invention discloses an apparatus and method for the allocation of redundant resources on an integrated circuit (IC). Upon verification that a particular resource is defective, means are provided to reconfigure the IC to utilize the redundant resource, instead of the defective resource.

In accordance with one embodiment of the invention, a field programmable gate array (FPGA) comprises a plurality of configurable interconnect resources that are coupled to a configuration memory and are adapted to activate signal routes within the FPGA in response to data contained in the configuration memory. The FPGA further comprises a first primary resource that is adaptively coupled to a first signal route in response to an affirmative test result for the first primary resource. The FPGA further comprises a first redundant resource that is adaptively coupled to the first signal route in response to a negative test result for the first primary resource. The first primary resource is deactivated in response to the negative test result.

In accordance with another embodiment of the invention, an integrated circuit (IC) comprises a reconfigurable routing network, a plurality of primary transceivers that are interconnected by the reconfigurable routing network, and a plurality of redundant transceivers that are interconnected by the reconfigurable routing network. In response to a failed test of a first primary transceiver, the first primary transceiver is replaced by a first redundant transceiver via adaptation of the reconfigurable routing network.

In accordance with another embodiment of the invention, a method of providing resource redundancy in a programmable logic device (PLD) comprises performing a test on a primary resource contained within the PLD, identifying a replacement resource contained within the PLD in response to a negative result of the test, reconfiguring the PLD to activate the replacement resource in response to the negative result of the test, and reconfiguring the PLD to deactivate the primary resource in response to the negative result of the test.

BRIEF DESCRIPTION OF THE DRAWINGS

Various aspects and advantages of the invention will become apparent upon review of the following detailed description and upon reference to the drawings in which.

DETAILED DESCRIPTION

Generally, the present invention is applied to the field of integrated circuits (IC) of which PLDs are a subset. In particular, a method and apparatus is presented to increase the yield of the PLDs, notwithstanding certain detected failures within the PLD. Certain resources within the PLD, for example, may be identified as exhibiting an increased failure rate, as compared to other resources of the PLD. In such instances, redundant resources are implemented within the PLD, such that upon detection of a failed primary resource, the redundant resource may be configured to replace the failed resource.

The replacement mechanism may be implemented at various stages of production of the PLD. For example, the replacement mechanism may be implemented during final test, such that multiplexer blocks may be reconfigured to "bypass" the failed resource(s). Additionally, power supply inputs to the failed resource(s) may also be deactivated, so as to conserve operational power of the PLD. Reconfiguration may be implemented using attribute bits of a configuration data stream, such that attribute bits associated with the failed resource may deactivate the failed resource and attribute bits associated with the redundant resource may be activated to replace the failed resource.

Alternately, the replacement mechanism may be initiated at wafer sort, whereby a wafer sort map is generated to identify the final die configuration to be used. For example, various redundant resources on the PLD may be identified by the wafer sort map. Any primary resources having failed a wafer test may also be identified by the wafer sort map. The redundant resources may then be identified and tagged as replacements for the failed primary resources. Accordingly, the wafer sort replacement mechanism may result in a variety of die bonding configurations, which may further necessitate multiple packaging configurations. Once packaged, the footprint of the device remains unchanged, so that the replacement of failed resources with redundant resources may be transparent to the end user.

The need for multiple packaging configurations may be obviated, however, through the use of fixed input/output (I/O) pads and associated I/O buffers. In one embodiment, for example, I/O pads and associated I/O buffers may remain statically defined, whereby reconfigurable routing occurs between the I/O buffer interface and the interchangeable resources of the PLD. As such, a single die configuration and a single package configuration may be accommodated through the use of reconfigurable signal routing to bypass and engage PLD resources as required.

Figure 1:
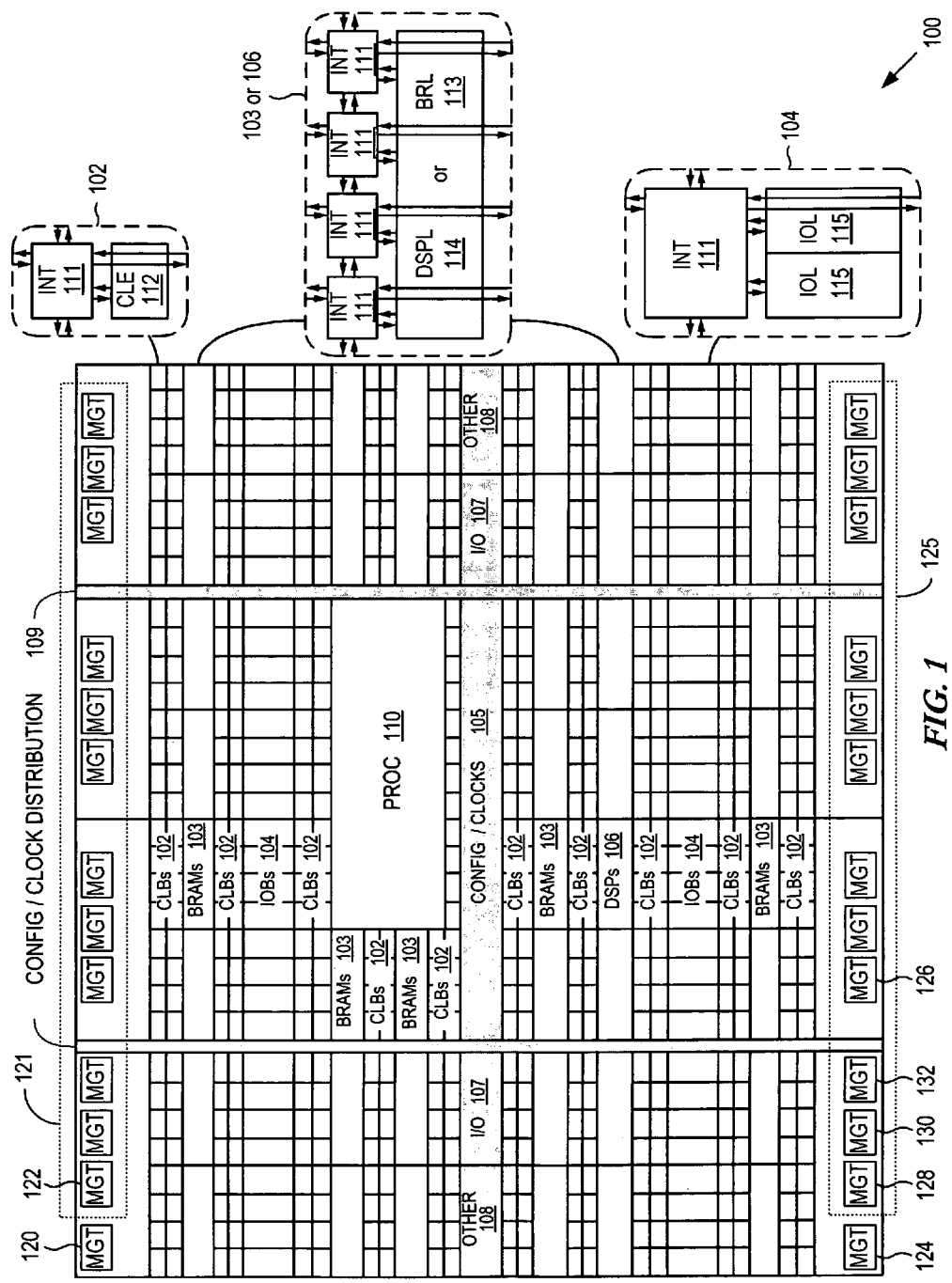
FIG. 1 illustrates an exemplary Field Programmable Gate Array (FPGA) architecture.

As noted above, advanced ICs, such as FPGAs, can include several different types of programmable logic blocks in the array. For example, FIG. 1 illustrates an IC that exemplifies FPGA architecture 100, including a large number of different programmable tiles such as Multi-Gigabit Transceivers (MGTs) 120-122 and 124-132, CLBs 102, BRAMs 103, IOBs 104, configuration and clocking logic CONFIG/CLOCKS 105, DSPs 106, specialized I/O 107, including configuration ports and clock ports, and other programmable logic 108, such as digital clock managers, analog-to-digital converters, system monitoring logic, and so forth. Some FPGAs also include dedicated processor blocks PROC 110, in which specific CPU related functionality may be utilized that is separate from the FPGA fabric.

In some FPGAs, each programmable tile includes programmable interconnect element INT 111 having standardized connections to and from a corresponding interconnect element in each adjacent tile. Therefore, the programmable interconnect elements taken together implement the programmable interconnect structure for the illustrated FPGA. INT 111 also includes the connections to and from the programmable logic element within the same tile, as shown by the examples of blocks 102 and 104.

For example, a CLB 102 may include a Configurable Logic Element CLE 112 that may be programmed to implement user logic plus a single programmable interconnect element INT 111. A BRAM 103 can include a BRAM logic element (BRL 113) in addition to one or more programmable interconnect elements. Typically, the number of interconnect elements included in a tile depends on the height of the tile (as measured from right to left of FIG. 1). In the pictured embodiment, a BRAM tile has the same height as four CLBs, but other numbers (e.g., five) can also be used. A DSP tile 106 can include a DSP logic element (DSPL 114) in addition to an appropriate number of programmable interconnect elements. An IOB 104 may include, for example, two instances of an input/output logic element IOL 115 in addition to one instance of the programmable interconnect element INT 111.

In the pictured embodiment, a columnar area near the center of the die (shown shaded in FIG. 1) may be used for configuration, clock, and other control logic. Horizontal areas 109 extending from this column may also be used to distribute the clocks and configuration signals across the breadth of the FPGA. In one embodiment, the shaded areas of FIG. 1 may also be used for any reconfigurable signal routing that may be required between any failed resources and those resources that are identified as being their replacements.

As discussed above, MGT columns 121 and 125 are resources that may provide primary serial I/O functionality for FPGA 100. In one embodiment, MGTs 120 and 124 may be reserved as replacements for the primary MGT resources of MGT columns 121 and 125, respectively. In such an instance, MGT 120 may be reserved as the replacement resource for any single MGT of MGT column 121 that may be found to be defective. Similarly, MGT 124 may be reserved as the replacement resource for any single MGT of MGT column 125 that may be found to be defective.

Figure 2A:
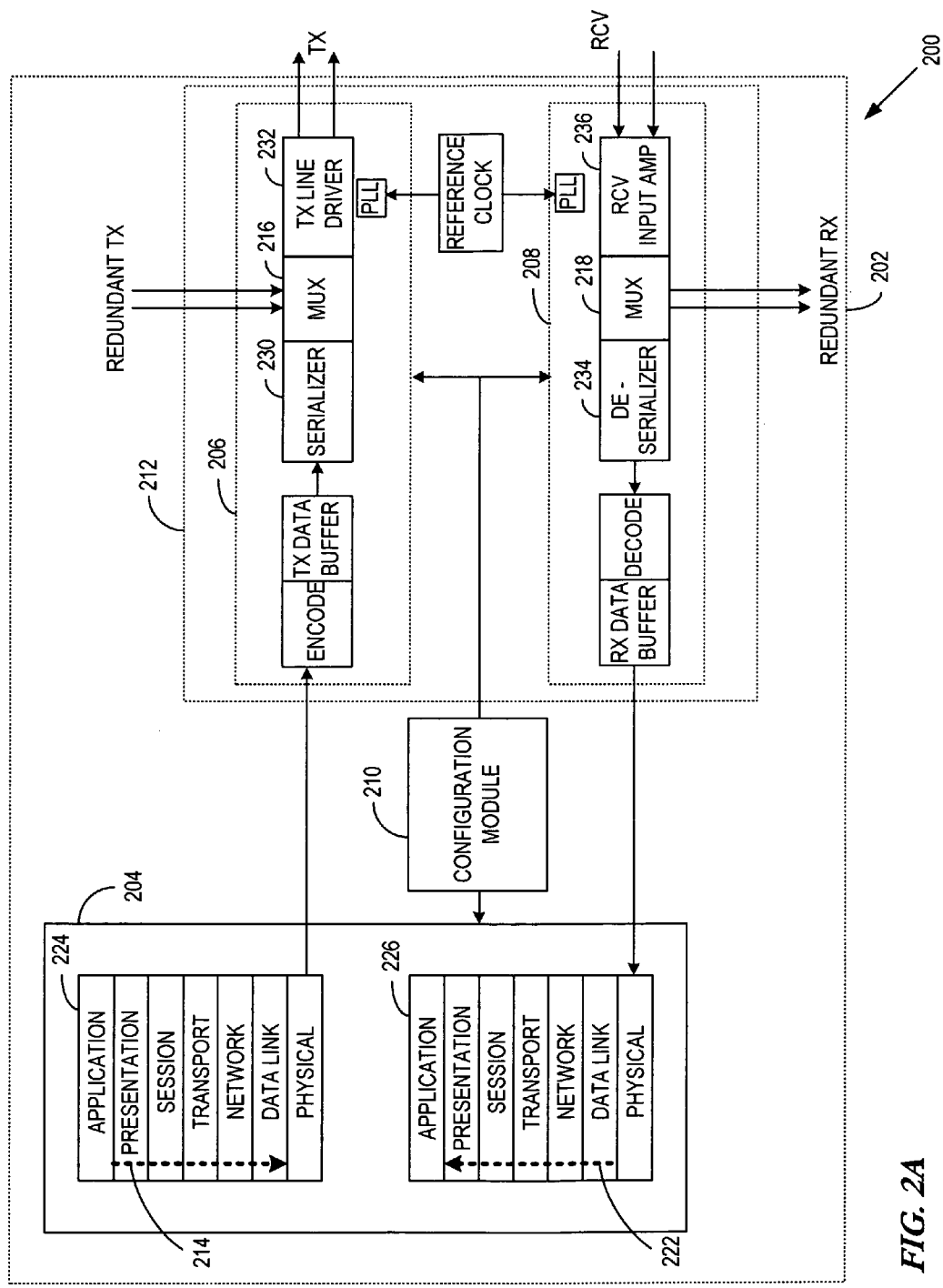
FIG. 2A illustrates an exemplary Field Programmable Gate Array (FPGA) application utilizing reconfigurable signal routing to bypass defective resources.

Turning to FIG. 2A, an exemplary FPGA block diagram 200 is illustrated in which FPGA 202 conducts serial communications with external communications equipment (not shown) via primary MGT 212 as shown. As discussed in more detail below, FPGA 202 may also be configured to conduct serial communications via redundant MGT resources 120 and/or 124 as discussed above, through appropriate configuration of multiplexers 216 and 218 and other reconfigurable signal routing. It should be noted that multiplexers 216 and 218 may be implemented via any number of reconfigurable logic devices, such as a CLB, switch, etc.

In a normal mode of operation, configuration module 210 may configure multiplexer 216 to interconnect serializer 230 and TX line driver 232 of transmitter 206. Similarly in the normal mode of operation, configuration module 210 may configure multiplexer 218 to interconnect de-serializer 234 and RCV input amplifier 236 of receiver 208.

In a bypass mode of operation, on the other hand, multiplexer 216 may be configured to accept data from a redundant MGT transmitter resource, as selected by multiplexer 216 and any intervening interconnections established by, e.g., CLB 102, of FIG. 1, as well as the mirroring multiplexing that is required at the redundant MGT transmitter resource. Similarly in the bypass mode of operation, multiplexer 218 may be configured to accept data from a redundant MGT receiver resource, as selected by multiplexer 218 and any intervening interconnections established by, e.g., CLB 102, of FIG. 1, as well as the mirroring multiplexing that is required at the redundant MGT receiver resource.

In a normal mode of operation, communication stacks 224 and 226, that may be associated with any number of communication protocols operating within FPGA 202, provide data frames to MGT transmitter 206. In such an instance, data frames outbound from FPGA fabric 204 may propagate from, for example, the application layer to the physical layer of communication stack 224 via communication path 214. Similarly in the normal mode of operation, external communications equipment (not shown) completes the communication link with FPGA 202 by transmitting data frames that are received by receiver 208. The data frames are then forwarded onto communication stack 226 of FPGA fabric 204 for subsequent processing by communication stack 226 via communication path 222.

In a bypass mode of operation, however, the physical coding sublayer (PCS) of transmitter 206 and/or receiver 208 may have been found to be defective during, for example, a final production test phase or post-production test phase. In such instances, the PCS functions of transmitter 206, e.g., the encoding and TX data buffering functions of transmitter 206, and/or the PCS functions of receiver 208, e.g., the RX data buffering and decoding functions of receiver 208, may be tagged as being defective via configuration module 210. In addition, SERDES 230/234 may also be tagged as defective resources, so that multiplexing/re-routing of the data paths between the primary and redundant MGT resources, in response to a MGT failure, may be facilitated using serial, as opposed to parallel, data paths.

Once certain resources within MGT 212 are tagged as being defective, configuration module 210 may reconfigure multiplexer 216 to accept serial data, i.e., REDUNDANT TX, from a redundant MGT resource, as opposed to accepting serial data from serializer 230. In a bypass mode of operation, therefore, signal REDUNDANT TX is provided to TX line driver 232 from a redundant MGT resource for subsequent transmission via transmit port TX. Similarly, configuration module 210 may reconfigure multiplexer 218 to provide serial data, i.e., REDUNDANT RX, to the redundant MGT resource, as opposed to providing the serial data to de-serializer 234. In a bypass mode of operation, therefore, an external signal from receive port, RCV, is received by RCV input amplifier 236 and is subsequently transmitted to the redundant MGT resource via signal REDUNDANT RX.

Turning back to FIG. 1, the bypass mode of operation may be explained in further detail for a given resource failure scenario. For example, MGT 122 of MGT column 121 may be determined to be the defective resource, while MGT 120 may be the designated redundant MGT resource for MGT column 121. In such an instance, the TX line driver and RCV input amplifier of MGT 122 may continue to be used, even though other portions of MGT 122 are found to be defective. Thus, all other defective circuitry of MGT 122 is effectively bypassed, as discussed above in relation to FIG. 2, via operation of multiplexers 216 and 218 and other reconfigurable signal routing. In such an instance, the PCS and serializer/deserializer (SERDES) portions of MGT 120 are used as a replacement for the corresponding PCS and SERDES portions of MGT 122.

In an alternate failure mode, MGT 126 of MGT column 125 may be determined to be the defective resource, while MGT 124 may be the designated redundant MGT resource for MGT column 125. In such an instance, a successive shift of MGT resources may be implemented. That is to say, for example, that MGT 132 may be implemented as the replacement MGT for defective MGT 126, as discussed above in relation to FIG. 2, via operation of multiplexers 216 and 218 and other reconfigurable signal routing.

Each immediately adjacent MGT of MGT column 125 may then act as the replacement MGT for its neighbor. For example: 1) MGT 130 is substituted for MGT 132, since MGT 132 was substituted for MGT 126; 2) MGT 128 is substituted for MGT 130, since MGT 130 was substituted for MGT 132; and finally 3) MGT 124 is substituted for MGT 128, since MGT 128 was substituted for MGT 130. It can be seen, therefore, that a first MGT resource is effectively "shifted" to replace the defective MGT resource, while subsequent MGT resources are effectively shifted to fill MGT resource gaps that were created by previous MGT resource shifts. Alternatively, MGT 124 may directly replace MGT 126 through appropriate signal routing and multiplexing using, for example, CLBs 102 and multiplexers 216 and 218 and other reconfigurable signal routing.

Figure 2B:
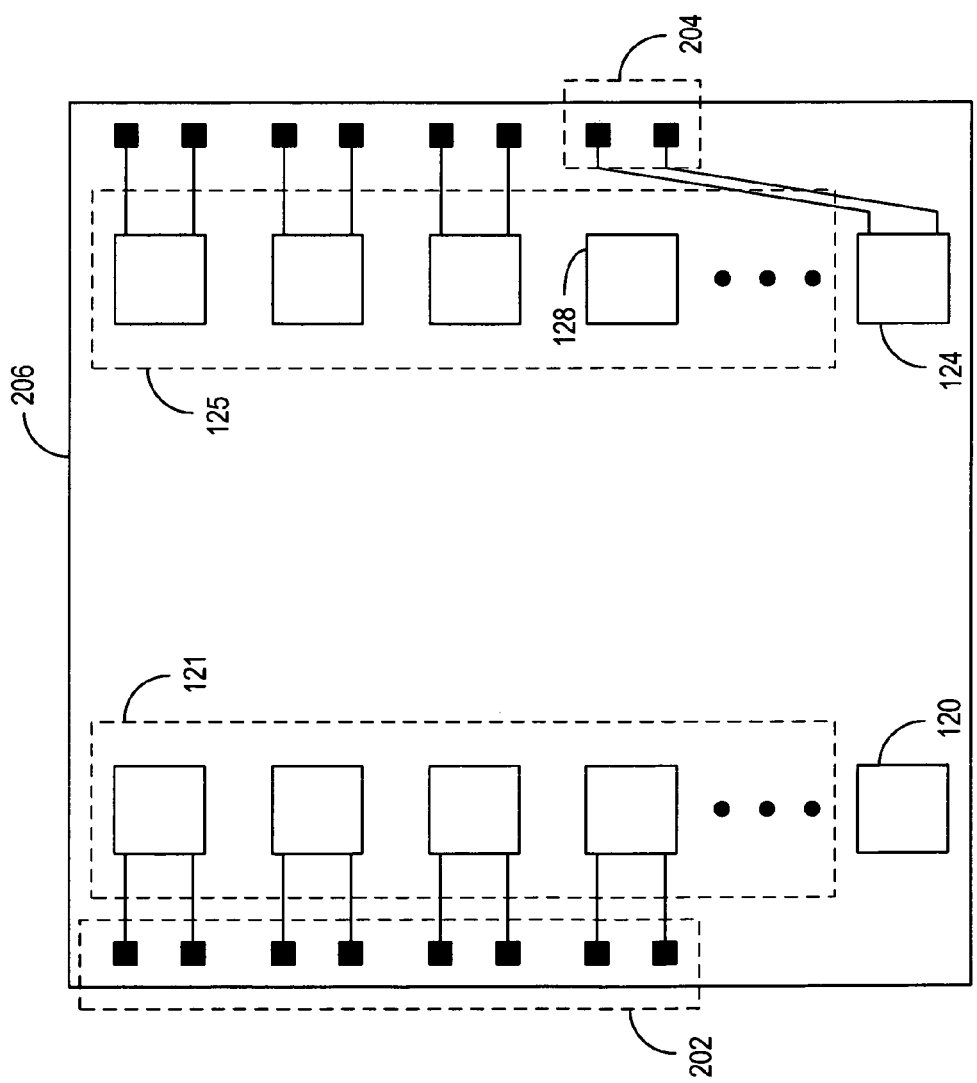
FIG. 2B illustrates an exemplary application to bypass defective resources via die bonding.

Turning to FIG. 2B, an alternate embodiment of defective resource replacement is exemplified, whereby the defective resource is identified at a wafer test phase. Columns 121 and 125 may represent, for example, the MGT columns as discussed above in relation to FIG. 1. MGT resources 120 and 124 also correspond to FIG. 1, such that MGT resource 120 may be reserved as the designated replacement for MGT column 121 and MGT resource 124 may be reserved as the designated replacement for MGT column 125.

MGT columns 121 and 125, as well as replacement MGT resources 120 and 124, each exist on a semiconductor die. The semiconductor die may constitute one of many semiconductor die that are located on a semiconductor wafer. At the wafer stage, wafer probes may be used to test the functionality of certain resources contained on each semiconductor die. As such, primary MGT resources of MGT columns 121 and 125, for example, may be exercised by the wafer probe in order to verify proper functionality. Should any primary MGT resource of MGT columns 121 and 125 be found to be defective, then the package containing the semiconductor die may be modified at the die bonding stage to effectively bypass the defective MGT resource.

For example, once each semiconductor die has been separated from the semiconductor wafer, the semiconductor die may be attached to package 206, which may be representative of a lead frame, hybrid substrate, flip-chip, printed circuit board, etc. As illustrated, all primary MGT resources of MGT column 121 passed their respective wafer testing, since each primary MGT resource is die bonded to its designated die bonding pad 202 as shown. Consequently, redundant MGT resource 120 is not needed as a replacement for the primary MGT resources of MGT column 121. It should be noted, that more than 2 die bond pads may be required for each MGT resource. Accordingly, FIG. 2B is merely illustrated for explanatory purposes.

Primary MGT resource 128 of MGT column 125, on the other hand, was found to be defective at wafer test. As such, MGT resource 128 is identified to the die bonder as being an invalid resource. Redundant MGT resource 124 is then identified as the replacement MGT resource for failed MGT resource 128. Thus, redundant MGT resource 124, as opposed to MGT resource 128, is die bonded to die bond pads 204 to effectively bypass MGT resource 128. Turning back to FIG. 2A, it can be seen that the entire MGT transmitter 206, and/or the entire MGT receiver 208, may be bypassed, since either the input of RCV input amplifier 236, and/or the output of TX line driver 232, may be die bonded to die bond pads 204. As such, even failures detected in either of RCV input amplifier 236 or TX line driver 232 may be circumvented by the die bonding bypass process as exemplified in FIG. 2B.

Figure 3:
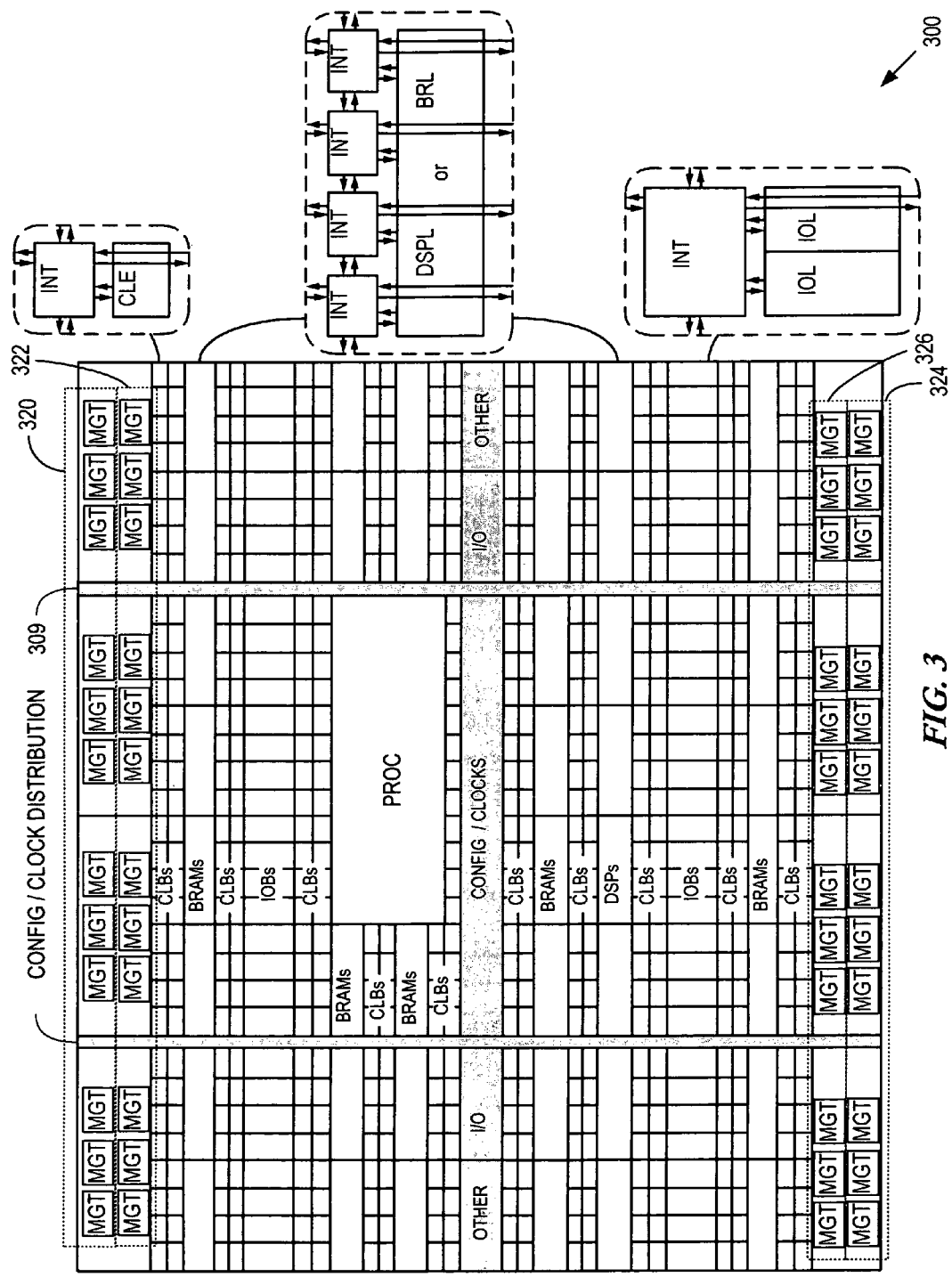
FIG. 3 illustrates an alternate Field Programmable Gate Array (FPGA) architecture.

Turning to FIG. 3, alternate FPGA architecture 300 is exemplified, whereby MGT columns 320-326 may be provided in a first embodiment. MGT columns 320 and 324 may, for example, be identified as primary MGT columns, while MGT columns 322 and 326 may, for example, be identified as redundant MGT columns. In such an instance, for each primary MGT resource provided in MGT columns 320 and 324, there is a corresponding redundant MGT resource identified in the adjacent MGT column. If a primary MGT resource is determined to be defective, then the replacement MGT resource is pre-determined and "shifted" in, as discussed above in relation to FIG. 2.

In an alternate embodiment, MGT column 322 or MGT column 326 may exist as the only redundant MGT column. In such instances, each replacement MGT resource of the replacement MGT column may be configured to replace any primary MGT resource found to be defective, no matter its location. For example, given that a primary MGT resource of MGT column 320 is determined to be defective and MGT column 326 is identified as the redundant MGT column, then any one of the MGT resources of MGT column 326 may replace the defective MGT resource of MGT column 320. The shaded portions of FIG. 1 may, for example, provide the conduit necessary to effect the signal routing between the defective MGT resources and their corresponding replacement MGT resources. It is recognized, that many combinations of defective and replacement MGT resource locations may be facilitated and the illustrations of FIGS. 1 and 3 are merely provided as two examples of such combinations.

Once an MGT resource is determined to be defective, its identity as a defective resource may then be identified through a permanent, or semi-permanent means, such as an electronic fuse (E-fuse), a programmable read only memory (PROM) device, or an electrically erasable PROM (EEPROM) device. In addition, all power supply connections to the defective resource may be disabled in order to reduce power consumption.

Figure 4:
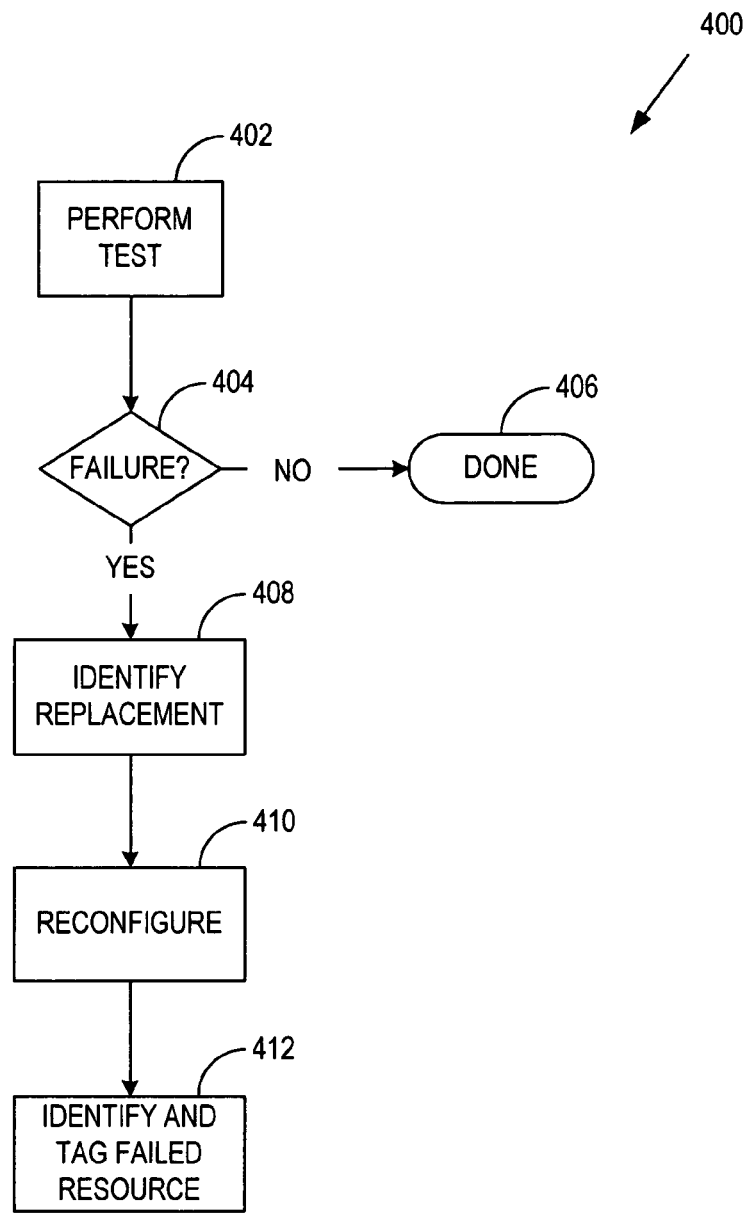
FIG. 4 illustrates an exemplary flow diagram illustrating a method of utilizing a redundant resource architecture.

Turning to FIG. 4, a flow diagram of an exemplary method of providing and utilizing redundant resources within an IC/wafer is illustrated. In step 402, testing is performed to determine whether a resource is defective. As discussed above, the testing may be performed at various phases of IC processing, such as during wafer sort, at final test, or even during a self-test after the IC is deployed. If no failures are detected, as determined in step 404, then the method completes and the IC continues use during a normal mode of operation.

If a defect is determined to exist within a resource, however, then a bypass mode of operation is initiated, as in step 408, to identify a replacement resource. After wafer sort testing, for example, any number of die packaging options may be utilized to implement the bypass mode, depending upon the particular resource that is found to be defective. For example, through die bonding only to those components found to be operational, various packaging options may be implemented in step 410 to connect the operational resources to the appropriate die bond pad as discussed above in relation to FIG. 2B.

After a final test of the component prior to shipment, or alternatively, after a self-test of the component after deployment, reconfiguration may alternatively be performed via a configuration bit stream download as in step 410. In particular, routing to and from the defective resource may be altered, as discussed above in relation to FIGS. 1, 2A, and 3, such that the replacement resource is configured for operation to bypass the defective resource.

In step 412, all defective resources are identified and tagged as being defective. The identification may be then be stored within an E-fuse, PROM, or other programmable device, such as an EEPROM. The identification of the failed resource is then made known to any future reconfiguration processes, so that the defective resource(s) may be removed from the available list of resource(s) during any subsequent reconfiguration events.

Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A field programmable gate array (FPGA), comprising:
a plurality of configurable interconnect resources coupled to a configuration memory and adapted to activate signal routes within the FPGA in response to data contained in the configuration memory;
a first primary resource adaptively coupled to a first signal route in response to an affirmative test result for the first primary resource; and
a first redundant resource adaptively coupled to the first signal route in response to a negative test result for the first primary resource, wherein the first primary resource is deactivated in response to the negative test result;
wherein the first redundant resource comprises a first multiplexer coupled to the first primary resource and adapted to provide outbound signals to the first primary resource via the first multiplexer in response to the negative test result, and
wherein the first primary resource comprises a second multiplexer coupled to the first redundant resource and adapted to provide outbound signals to the first redundant resource via the second multiplexer in response to the negative test result.

2. The FPGA of claim 1, wherein the first primary resource comprises a multi-gigabit transceiver (MGT).

3. The FPGA of claim 2, wherein the MGT further comprises a third multiplexer coupled to the first redundant resource and adapted to receive inbound signals from the first redundant resource via the third multiplexer in response to the negative test result.

4. The FPGA of claim 1, wherein the first redundant resource comprises a multi-gigabit transceiver (MGT).

5. The FPGA of claim 4, wherein the MGT further comprises a third multiplexer coupled to the first primary resource and adapted to receive inbound signals from the first primary resource via the third multiplexer in response to the negative test result.

6. The FPGA of claim 1, wherein the first redundant resource is a neighboring resource to the first primary resource.

7. The FPGA of claim 1, wherein the first redundant resource is not a neighboring resource to the first primary resource.

8. The FPGA of claim 1, wherein the first signal route comprises an input/output (I/O) pad of the FPGA that is die bonded to the first primary resource in response to the affirmative test result.

9. The FPGA of claim 8, wherein the I/O pad is die bonded to the first redundant resource in response to the negative test result.

10. An integrated circuit (IC), comprising:
a reconfigurable routing network;
a plurality of primary transceivers interconnected by the reconfigurable routing network; and
a plurality of redundant transceivers interconnected by the reconfigurable routing network, wherein in response to a failed test of a first primary transceiver, the first primary transceiver is replaced by a first redundant transceiver via adaptation of the reconfigurable routing network;
wherein a first primary transceiver of the plurality of primary transceivers comprises a first multiplexer coupled to a first redundant transceiver of the plurality of redundant transceivers, the first primary transceiver being adapted to provide outbound signals to the first redundant transceiver via the first multiplexer in response to the failed test, and
wherein the first primary transceiver further comprises a second multiplexer coupled to the first redundant transceiver, the first primary transceiver being adapted to receive inbound signals from the first redundant transceiver via the second multiplexer in response to the failed test.

11. The IC of claim 10, wherein a first redundant transceiver of the plurality of redundant transceivers comprises a third multiplexer coupled to a second primary transceiver of the plurality of primary transceivers, the first redundant transceiver being adapted to provide outbound signals to the second primary transceiver via the third multiplexer in response to the failed test.

12. The IC of claim 11, wherein the first redundant transceiver further comprises a fourth multiplexer coupled to the second primary transceiver, the first redundant transceiver being adapted to receive inbound signals from the second primary transceiver via the fourth multiplexer in response to the failed test.

13. An integrated circuit comprising:
a plurality of configurable interconnect resources coupled to a configuration memory and adapted to activate signal routes within the integrated circuit in response to data contained in the configuration memory;
a first primary resource adaptively coupled to a first signal route in response to an affirmative test result for the first primary resource; and
a first redundant resource adaptively coupled to the first signal route in response to a negative test result for the first primary resource, wherein the first primary resource is deactivated in response to the negative test result;
wherein the first redundant resource comprises a first multiplexer coupled to the first primary resource and adapted to provide outbound signals to the first primary resource via the first multiplexer in response to the negative test result, and wherein the first primary resource comprises a second multiplexer coupled to the first redundant resource and adapted to provide outbound signals to the first redundant resource via the second multiplexer in response to the negative test result.

14. The integrated circuit of claim 13, wherein the first primary resource comprises a multi-gigabit transceiver (MGT).

15. The integrated circuit of claim 14, wherein the MGT further comprises a third multiplexer coupled to the first redundant resource and adapted to receive inbound signals from the first redundant resource via the third multiplexer in response to the negative test result.

16. The integrated circuit of claim 13, wherein the first redundant resource further comprises a third multiplexer coupled to the first primary resource and adapted to receive inbound signals from the first primary resource via the third multiplexer in response to the negative test result.

17. The integrated circuit of claim 13, wherein the first redundant resource is a neighboring resource to the first primary resource.

18. The integrated circuit of claim 13, wherein the first redundant resource comprises a multi-gigabit transceiver (MGT).

* * * * *